United States Patent
Su (10) Patent No.: US 11,133,356 B2
(45) Date of Patent: Sep. 28, 2021

(54) TOUCH PANEL, METHOD FOR MANUFACTURING THE SAME, AND TOUCH DEVICE

(71) Applicant: SHENZHEN ROYOLE TECHNOLOGIES CO., LTD., Guangdong (CN)

(72) Inventor: Weisheng Su, Guangdong (CN)

(73) Assignee: SHENZHEN ROYOLE TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/878,990

(22) Filed: May 20, 2020

(65) Prior Publication Data
US 2020/0279891 A1 Sep. 3, 2020

Related U.S. Application Data

(63) Continuation of application No. PCT/CN2017/112036, filed on Nov. 21, 2017.

(51) Int. Cl.
*H01L 27/32* (2006.01)
*G06F 3/044* (2006.01)
(Continued)

(52) U.S. Cl.
CPC .......... *H01L 27/323* (2013.01); *G06F 3/0412* (2013.01); *G06F 3/0416* (2013.01);
(Continued)

(58) Field of Classification Search
CPC ............... H01L 27/3248; H01L 27/323; H01L 27/3276; H01L 2227/323; H01L 51/56;
(Continued)

(56) References Cited

U.S. PATENT DOCUMENTS

2010/0238140 A1 9/2010 Liu et al.
2014/0183478 A1* 7/2014 Lee ..................... H01L 27/323
257/40

(Continued)

FOREIGN PATENT DOCUMENTS

CN 102609142 A 7/2010
CN 102023737 A 4/2011
(Continued)

OTHER PUBLICATIONS

International Search Report issued in corresponding International Application No. PCT/CN2017/112036, dated Jul. 31, 2018, pp. 1-2, State Intellectual Property Office of the P.R. China, Beijing, China.

*Primary Examiner* — Muhammad N Edun
(74) *Attorney, Agent, or Firm* — Hauptman Ham, LLP (57) ABSTRACT

A touch panel including a flexible substrate, a thin film transistor layer, an anode layer, a light emitting layer, and a cathode layer which are stacked in sequence. The thin film transistor layer includes a drain. The anode layer is electrically connected with the drain. The cathode layer includes multiple touch electrodes arranged in matrix. The touch electrodes are insulated from one another at intervals, and each touch electrode is electrically connected with a signal transmission line. Time for displaying each frame in the touch panel includes display time and touch detection time. A method for manufacturing the touch panel is also provided.

20 Claims, 9 Drawing Sheets

(51) Int. Cl.
*G06F 3/041* (2006.01)
*H01L 51/00* (2006.01)
*H01L 51/52* (2006.01)
*H01L 51/56* (2006.01)

(52) U.S. Cl.
CPC ........ *G06F 3/0443* (2019.05); *H01L 27/3248* (2013.01); *H01L 27/3276* (2013.01); *H01L 51/0097* (2013.01); *H01L 51/5253* (2013.01); *H01L 51/56* (2013.01); *G06F 2203/04102* (2013.01); *G06F 2203/04103* (2013.01); *H01L 2227/323* (2013.01); *H01L 2251/5338* (2013.01)

(58) Field of Classification Search
CPC ............. H01L 51/0097; H01L 51/5253; H01L 2251/5338; G06F 3/0443; G06F 3/0412; G06F 3/0416; G06F 2203/04102; G06F 2203/04103; G06F 3/04182; G06F 3/044; G06F 3/0445; Y02E 10/549
See application file for complete search history.

(56) References Cited

U.S. PATENT DOCUMENTS

| | | | |
|---|---|---|---|
| 2018/0067589 A1* | 3/2018 | Leng | G02F 1/13338 |
| 2018/0348926 A1* | 12/2018 | Su | H01L 27/3276 |
| 2019/0056829 A1* | 2/2019 | Ye | H01L 51/5206 |
| 2019/0294280 A1* | 9/2019 | Zeng | G06F 3/0446 |

FOREIGN PATENT DOCUMENTS

| | | |
|---|---|---|
| CN | 104881179 A | 9/2015 |
| CN | 105094491 A | 11/2015 |

* cited by examiner

FORM AN ENCAPSULATION LAYER WHICH IS DISPOSED ON A SURFACE OF THE CATHODE LAYER AWAY FROM THE LIGHT EMITTING LAYER TO PROTECT THE CATHODE LAYER ⎯ S700

FIG. 13

FORM A SPACER LAYER WHICH IS FILLED IN A GAP BETWEEN THE TWO ADJACENT TOUCH ELECTRODES TO SEPARATE THE TWO ADJACENT TOUCH ELECTRODES FROM EACH OTHER ⎯ S800

FIG. 14

FORM A CONDUCTIVE LAYER WHICH IS DISPOSED BETWEEN THE TOUCH ELECTRODES AND THE SIGNAL TRANSMISSION LINE TO ELECTRICALLY CONNECT THE TOUCH ELECTRODES WITH THE SIGNAL TRANSMISSION LINE ⎯ S900

FIG. 15

FORM A BUFFER LAYER WHICH DISPOSED BETWEEN THE FLEXIBLE SUBSTRATE AND THE THIN FILM TRANSISTOR LAYER ⎯ S1000

TOUCH PANEL, METHOD FOR MANUFACTURING THE SAME, AND TOUCH DEVICE

CROSS-REFERENCE TO RELATED APPLICATION(S)

This application is a continuation of International Application No. PCT/CN2017/112036, filed on Nov. 21, 2017, the entire disclosure of which is hereby incorporated by reference in its entirety.

TECHNICAL FIELD

The present disclosure relates to the field of touch technology, and particularly to a touch panel, a method for manufacturing the same, and a touch device.

BACKGROUND

Organic light-emitting diode (OLED) display technology has advantages of self-luminescence, wide viewing angle, high contrast, low power consumption, high reaction speed and the like, and has been applied more and more. When the organic light-emitting diode is applied to a touch device, a touch sensor is usually attached outside the organic light-emitting diode display to form the touch device. However, with this structural design, the touch device is generally too thick.

SUMMARY

Embodiments of the present disclosure provide a touch panel. The touch panel includes a flexible substrate, a thin film transistor layer, an anode layer, a light emitting layer, and a cathode layer which are stacked in sequence. The thin film transistor layer includes a drain. The anode layer is electrically connected with the drain. The cathode layer includes multiple touch electrodes arranged in matrix, and the touch electrodes are insulated from one another at intervals. Each touch electrode is electrically connected with a signal transmission line. Time for displaying each frame in the touch panel includes display time and touch detection time. Within the display time, the anode layer is configured to be loaded with a first electrical signal, and each touch electrode in the cathode layer is configured to be loaded with a second electrical signal through a first signal line electrically connected with a signal transmission line. The first electrical signal is used for cooperating with the second electrical signal to make the light emitting layer emit light. Within the touch detection time, each touch electrode in the cathode layer is configured to be loaded with a touch detection signal through a second signal line which is electrically connected with the signal transmission line. The touch detection signal is used for detecting a position of a touch action on the touch panel.

Compared with the prior art, the touch panel of the present disclosure includes a flexible substrate, a thin film transistor layer, an anode layer, a light emitting layer, and a cathode layer which are stacked in sequence. The thin film transistor layer includes a drain, and the anode layer is electrically connected with the drain. The cathode layer is patterned to form multiple touch electrodes. That is, the cathode layer is used as touch electrodes, therefore, there is no need to provide an additional touch electrode structure separately, and the thickness and weight of the touch device can be reduced. The cathode layer and the touch electrodes of the display structure can be formed in the same process, so that the manufacturing process can be simplified and the manufacturing cost can be reduced, and the circuit layout can be simplified. Further, since the touch panel is thin, when the light emitted by the light emitting layer exits, the transmission path of the light may become shorter and the loss of the light may be reduced, therefore, the transmittance of the light can be improved. In addition, since the cathode layer is also used as the touch electrode structure, a substrate on which the touch electrode structure is provided can be omitted, and the manufacturing cost can be further reduced.

The embodiments of the present disclosure further provide a method for manufacturing a touch panel. The method includes the following.

A flexible substrate is provided.

A thin film transistor layer which covers the flexible substrate is formed, where the thin film transistor layer includes a drain.

An anode layer which covers the thin film transistor layer is formed, where the anode layer is electrically connected with the drain.

A light emitting layer which covers the anode layer is formed.

A cathode layer which covers the light emitting layer is formed, where the cathode layer includes multiple touch electrodes arranged in matrix, and the touch electrodes are insulated from one another at intervals.

A signal transmission line electrically connected with each of the touch electrodes is formed.

The embodiments of the present disclosure further provide a touch device. The touch device includes the touch panel as described above.

BRIEF DESCRIPTION OF THE DRAWINGS

To describe the technical solutions in the embodiments of the present disclosure more clearly, the following will briefly introduce the drawings required for describing the embodiments. Apparently, the drawings in the following description illustrate only some embodiments of the present disclosure. Those of ordinary skill in the art may also obtain other drawings based on these drawings without creative efforts.

DETAILED DESCRIPTION OF ILLUSTRATED EMBODIMENTS

Technical solutions in the embodiments of the present disclosure will be described clearly and completely hereinafter with reference to the drawings in the embodiments of the present disclosure. Apparently, the described embodiments are merely some rather than all embodiments of the present disclosure. All the other embodiments obtained by those of ordinary skill in the art based on the embodiments of the present disclosure without creative efforts shall fall within the protection scope of the present disclosure.

In addition, the following description of the embodiments is made with reference to the drawings to illustrate specific embodiments in which the present disclosure can be implemented. For example, "top", "bottom", "up", "down", "front", "back", "left", "right", "inside", "outside", "side" and the like are only reference to the orientation of the drawings, therefore, directional terms are used to illustrate and understand the present disclosure better and more clearly, and are not intended to indicate or imply that the device or component must have a specific orientation or be constructed and operated in a specific orientation, and therefore may not be a limit to the present disclosure.

A numerical range represented by "~" in this specification refers to the range which takes the values recorded before and after "~" as the minimum value and the maximum value respectively. In the drawings, similar or identical structures are denoted by identical numerals.

Figure 1:
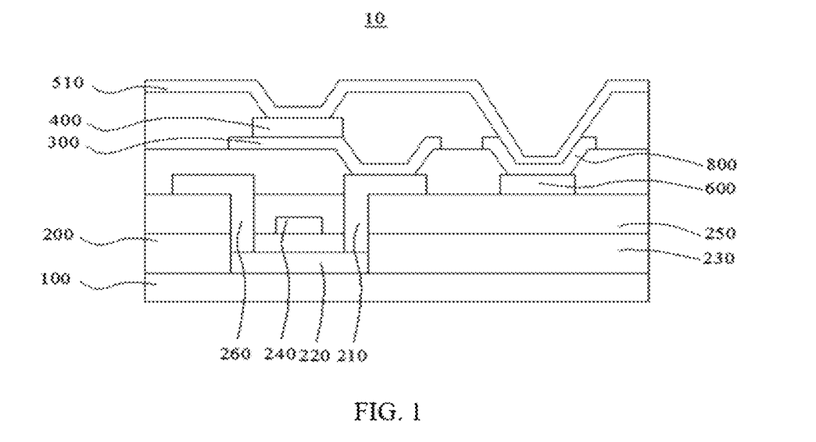
FIG. 1 is a schematic structural diagram of a touch panel according to an embodiment of the present disclosure.
Figure 2:
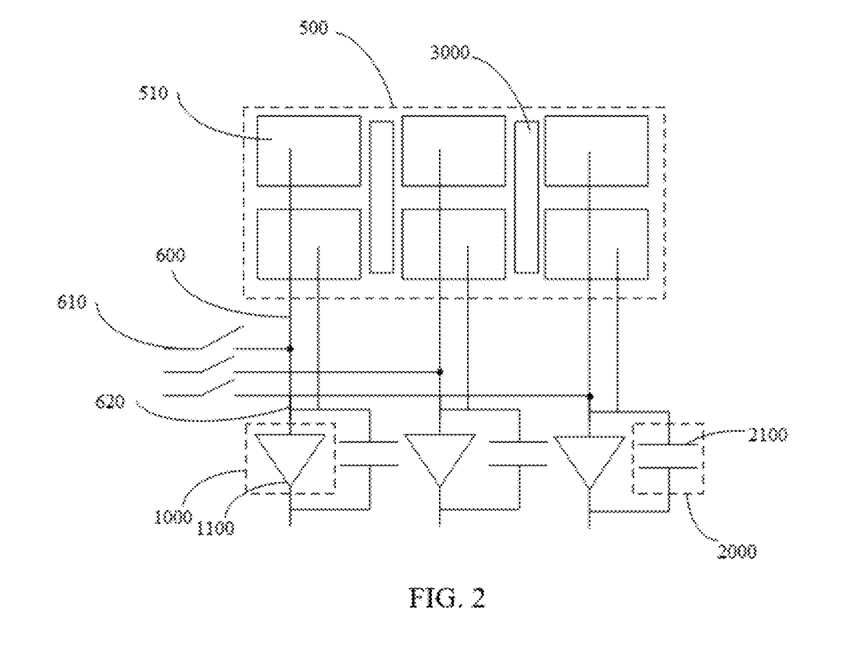
FIG. 2 is a schematic structural diagram of a circuit structure of the touch panel according to an embodiment of the present disclosure.

FIG. 1 is a schematic structural diagram of a touch panel according to an embodiment of the present disclosure. FIG. 2 is a schematic structural diagram of the circuit structure of the touch panel according to the embodiment of the present disclosure. As illustrated in FIG. 1 and FIG. 2, the touch panel 10 includes a flexible substrate 100, a thin film transistor layer 200, an anode layer 300, a light emitting layer 400, and a cathode layer 500 which are stacked in sequence. The thin film transistor layer 200 includes a drain 210, and the anode layer 300 is electrically connected with the drain 210. The cathode layer 500 includes multiple touch electrodes 510 arranged in matrix. The touch electrodes 510 are insulated from one another at intervals, and each touch electrode 510 is electrically connected with a signal transmission line 600. Time for displaying each frame in the touch panel 10 includes display time and touch detection time. Within the display time, the anode layer 300 is configured to be loaded with a first electrical signal. Each touch electrode 510 in the cathode layer 500 is configured to be loaded with a second electrical signal through a first signal line 610 which is electrically connected with a signal transmission line 600. The first electrical signal is used for cooperating with the second electrical signal to make the light emitting layer 400 emit light. Within the touch detection time, each touch electrode 510 in the cathode layer 500 is configured to be loaded with a touch detection signal through a second signal line 620 which is electrically connected with the signal transmission line 600. The touch detection signal is used for detecting a position of a touch action on the touch panel 10.

The flexible substrate 100 is composed of polyimide film (PI) or polyester film and copper foil. The polyimide has excellent properties such as high temperature soldering resistance, high strength, high modulus, and flame retardant, polyimide, and as a polymer material, it has outstanding thermal stability, good radiation resistance, good chemical stability, and excellent mechanical properties.

The thin film transistor layer 200 further includes a channel layer 220, a first insulating layer 230, a gate 240, a second insulating layer 250, and a source 260. The channel layer 220 is disposed on the flexible substrate 100, and the first insulating layer 230 covers the channel layer 220. The gate 240 is disposed on the first insulating layer 230, and the gate 240 is disposed corresponding to the channel layer 220. The second insulating layer 250 covers the gate 240. The source 260 and the drain 210 are both disposed on the second insulating layer 250. The source 260 and the drain 210 are disposed at intervals. The source 260 is electrically connected with one end of the channel layer 220 through the through holes defined in the first insulating layer 230 and the second insulating layer 250. The drain 210 is electrically connected with the other end of the channel layer 220 through the through holes defined in the first insulating layer 230 and the second insulating layer 250.

In an embodiment, the light emitting layer 400 is an organic light emitting layer.

The anode layer 300 is disposed on the surface of the drain 210, and the anode layer 300 is electrically connected with the drain 210. The anode layer 300 may be electrically connected to the drain 210 either by close contact of their surfaces or by bridge connection.

The cathode layer 500 includes multiple touch electrodes 510 arranged in matrix. The touch electrodes 510 can be in the shape of triangular, rectangular or rhombus. The shape of the touch electrodes 510 is not limited herein.

Within the display time, the anode layer 300 is configured to be loaded with a first electrical signal. Each touch electrode 510 in the cathode layer 500 is configured to be loaded with a second electrical signal through a first signal line 610 which is electrically connected with a signal transmission line 600. The first electrical signal is used for cooperating with the second electrical signal to make the light emitting layer 400 emit light. The first electrical signal is at high potential and the second electrical signal is at low potential. For example, the first electrical signal of the anode layer is a voltage of 15V. Each touch electrode 510 in the cathode layer 500 is configured to be loaded with a second electrical signal, which is a voltage of 0V, through a first signal line 610 which is electrically connected with the signal transmission line 600.

Within the touch detection time, each touch electrode 510 in the cathode layer 500 is configured to be loaded with a touch detection signal through a second signal line 620 which is electrically connected with the signal transmission line 600. The touch detection signal is used for detecting a position of a touch action on the touch panel 10. In this embodiment, in the touch panel 10, an integrated circuit is used to provide the touch detection signal to scan and detect the touch electrode 510. When a touch object touches the touch panel 10, the capacitance of the touch panel 10 will change, causing the current in the touch detection signal to change. According to the current change in the touch detection signal, the position of the touch action on the touch panel can be detected.

Within the touch detection time, each touch electrode 510 in the cathode layer 500 is configured to be loaded with a third electrical signal through a first signal line 610 which is electrically connected with a signal transmission line 600. The third electrical signal is used for cooperating with the first electrical signal to make the light emitting layer 400 emit light. The third electrical signal is at high potential and the first electrical signal is at low potential. Specifically, for example, the first electrical signal of the anode layer is a voltage of 15V. Each touch electrode 510 in the cathode layer 500 is configured to be loaded with a third electrical signal, which is a voltage of 30V, through a first signal line 610 which is electrically connected with the signal transmission line 600.

The touch panel 10 further includes an amplifying circuit 1000. The amplifying circuit 1000 is configured to amplify the touch detection signal by a preset amplification factor. The amplifying circuit 1000 includes an amplifier 1100. The amplifier 1100 is a device capable of amplifying the voltage or power of an input signal and is composed of an electron tube or transistor, a power transformer, and other electrical components. Specifically, the amplifying circuit 1000 is configured to amplify weak touch detection signal, improving the sensitivity of touch detection.

The touch panel 10 further includes a filter circuit 2000. The filter circuit 2000 is configured to filter out clutter in the touch detection signal. In this embodiment, the filter circuit 2000 includes a filter capacitor 2100. The filter capacitor 2100 can effectively filter out signals of a preset frequency or signals outside a preset frequency interval in the signal transmission line 600, to obtain a touch detection signal of a preset frequency.

In this embodiment, the signal transmission line 600 is disposed on the same layer as the drain 210 of the thin film transistor layer 200. Specifically, the signal transmission line 600 and the drain 210 are both disposed on the second insulating layer 250. In a manufacturing process, the signal transmission line 600 and the drain 210 of the thin film transistor layer 200 are formed in the same process. Specifically, after the second insulating layer 250 is formed, one metal layer is formed on the whole second insulating layer 250, and the signal transmission line 600 is formed when the metal layer is patterned to form the drain 210 of the thin film transistor layer 200. The signal transmission line 600 and the drain 210 are formed in the same process, which can simplify the manufacturing process.

Figure 3:
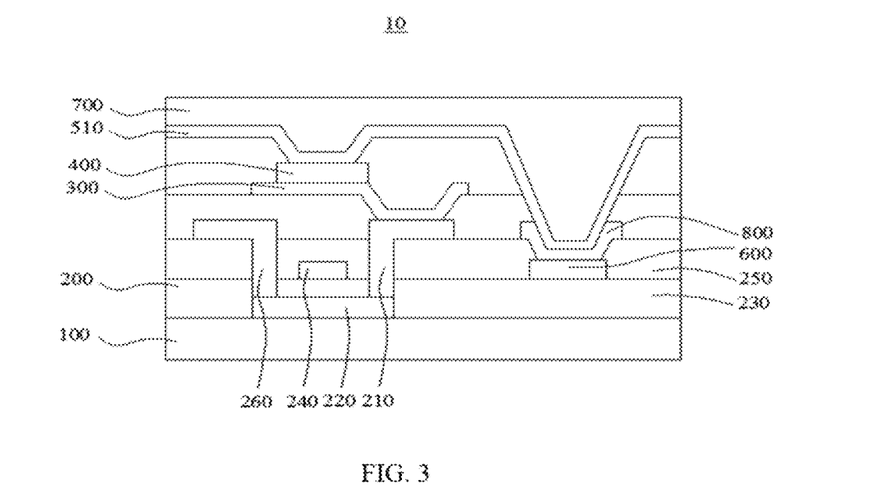
FIG. 3 is a schematic structural diagram of a touch panel according to another embodiment of the present disclosure.

In other embodiments, the signal transmission line 600 is disposed on the same layer as the gate 220 of the thin film transistor layer 200. As illustrated in FIG. 3, the signal transmission line 600 and the gate 240 are both disposed on the first insulating layer 230. In practice, the signal transmission line 600 and the gate 220 of the thin film transistor layer 200 are formed in the same process. Specifically, after the first insulating layer 230, one metal layer is formed on the whole first insulating layer 230. The signal transmission line 600 is formed when the metal layer is patterned to form the gate 220 of the thin film transistor layer 200. The signal transmission line 600 and the gate 220 are formed in the same process, which can simplify the manufacturing process.

Figure 4:
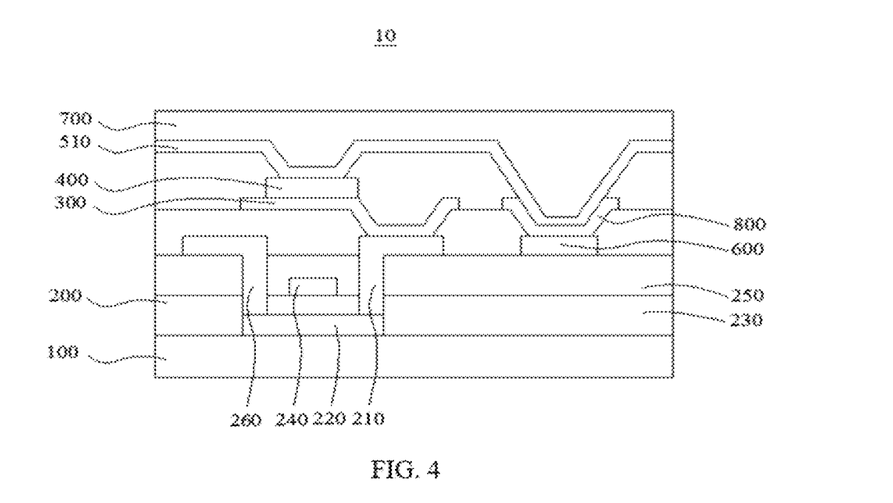
FIG. 4 is a schematic structural diagram of a touch panel according to another embodiment of the present disclosure.

The touch panel 10 further includes an encapsulation layer 700. The encapsulation layer 700 is disposed on a surface of the cathode layer 500 away from the light emitting layer 400 to protect the cathode layer 500. As illustrated in FIG. 4, the encapsulation layer 700 may be configured to insulate and isolate two adjacent touch electrodes 510. Specifically, when forming the encapsulation layer 700, the encapsulation layer 700 is filled between the two adjacent touch electrodes 510 to isolate the two adjacent touch electrodes 510. With this structural design, the two adjacent touch electrodes 510 can be insulated and isolated when the encapsulation layer 700 is formed, and no additional isolating layer is needed between the two adjacent touch electrodes 510, and the manufacturing process can be simplified.

In this embodiment, the encapsulation layer 700 adopts thin film encapsulation for protecting the cathode layer 500. The cathode layer 500 and each film layer below the cathode layer 500 need to be isolated from the outside, so as to prevent the cathode layer 500 and each film layer below the cathode layer 500 from being corroded by impurities in the air, which may lead to a decrease in electrical performance. Surface of the cathode layer 500 and each film layer below the cathode layer 500 as well as the signal transmission line, the first signal line, and the second signal line are protected, so that the cathode layer 500 and each layer below the cathode layer 500 can be protected from damage caused by external force and the influence of the external environment in terms of electrical or thermo-physical. Further, through packaging, the thermal expansion coefficients of the cathode layer 500 and each film layer below the cathode layer 500 can match the thermal expansion coefficients of the frame or the substrate. In this way, the stress caused by changes in the external environment (such as heat) and the stress caused by chip heating can be relieved, and the cathode layer 500 and each film layer below the cathode layer 500 can be prevented from being damaged or failed. The thinner the encapsulation is, the better the heat dissipation is. In another aspect, the encapsulated cathode layer 500 and each film layer below the cathode layer 500 are also more convenient for installation and transportation.

As illustrated in FIG. 2, the touch panel 10 further includes a spacer layer 3000. The spacer layer 3000 is filled in a gap between the two adjacent touch electrodes 510 to separate the two adjacent touch electrodes 510 from each other.

Specifically, the spacer layer 3000 is made of insulating material of a network-like or strip-like structure, and is filled in a gap between the two adjacent touch electrodes 510 to separate the two adjacent touch electrodes 510 from each other. Accidental contact between the two adjacent touch electrodes 510 can be avoided, thereby avoiding touch failing and helping to improve touch sensitivity.

A conductive layer 800 is disposed between the touch electrodes 510 and the signal transmission line 600, where the conductive layer 800 is configured to electrically connect the touch electrodes 510 with the signal transmission line 600. Specifically, the conductive layer 800 is disposed between the touch electrodes 510 and the signal transmission line 600, as a result, the contact resistance between the touch electrodes 510 and the signal transmission line 600 can be reduced.

Figure 5:
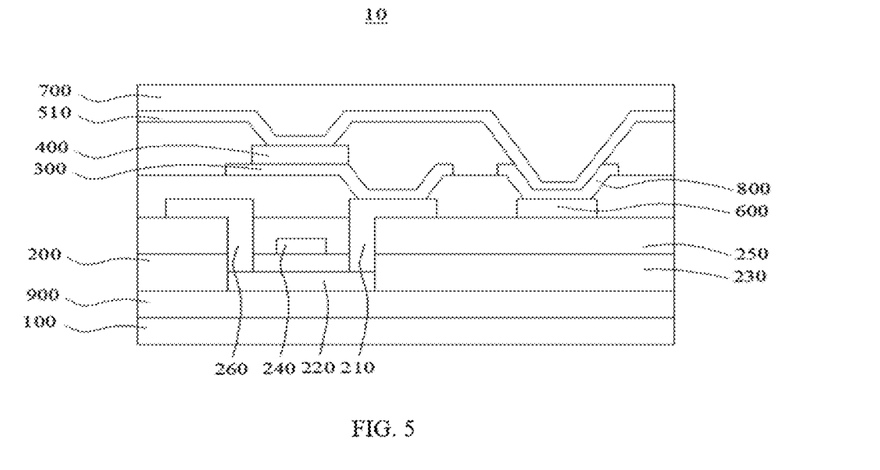
FIG. 5 is a schematic structural diagram of a touch panel according to an embodiment of the present disclosure.

The touch device 10 further includes a buffer layer 900. The buffer layer 900 is disposed between the flexible substrate 100 and the thin film transistor layer 200. As illustrated in FIG. 5, the buffer layer 900 is disposed between the flexible substrate 100 and the thin film transistor layer 200. This helps to reduce damage to the flexible substrate 100 when manufacturing various film layers such as the thin film transistor layer 200 on the flexible substrate 100, or to reduce impact on the flexible substrate 100 when using the touch panel, helping to prolong the service life of the touch panel 10.

The touch panel of the present disclosure includes a flexible substrate, a thin film transistor layer, an anode layer, a light emitting layer, and a cathode layer which are stacked in sequence. The thin film transistor layer includes a drain, and the anode layer is electrically connected with the drain. The cathode layer is patterned to form multiple touch electrodes. That is, the cathode layer is used as touch electrodes, therefore, there is no need to provide an additional touch electrode structure separately, and the thickness and weight of the touch device can be reduced. The cathode layer and the touch electrodes of the display structure can be formed in the same process, so that the manufacturing process can be simplified and the manufacturing cost can be reduced, and the circuit layout can be simplified. Further, since the touch panel is thin, when the light emitted by the light emitting layer exits, the transmission path of the light may become shorter and the loss of the light may be reduced, therefore, the transmittance of the light can be improved. In addition, since the cathode layer is also used as the touch electrode structure, a substrate on which the touch electrode structure is provided can be omitted, and the manufacturing cost can be further reduced.

Figure 6:
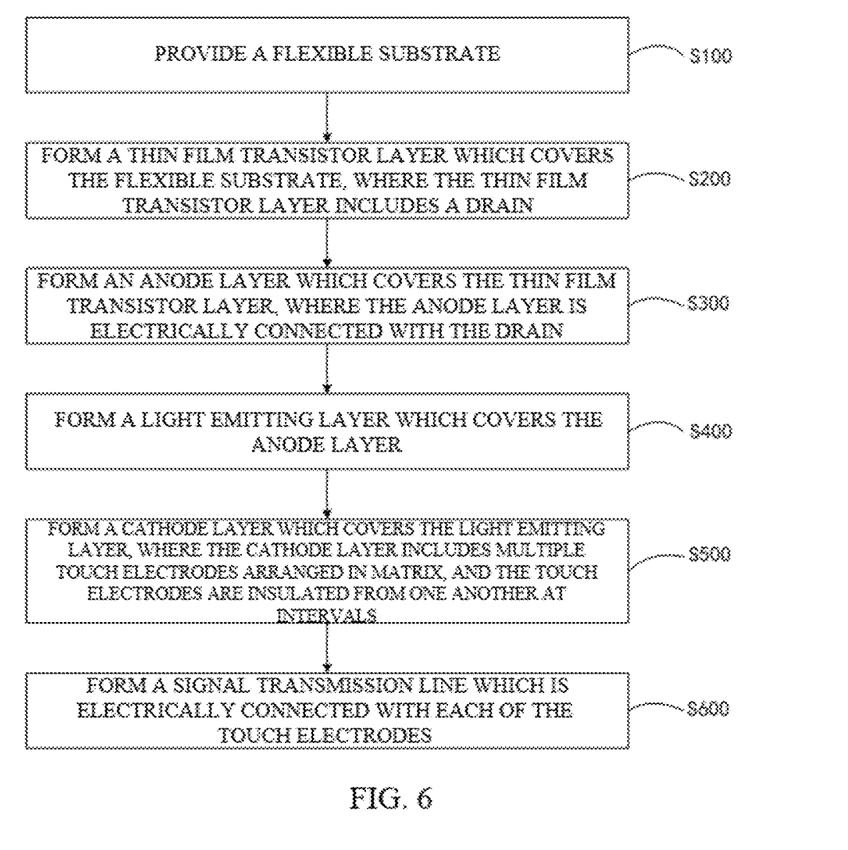
FIG. 6 is a flowchart of a method for manufacturing a touch panel according to an embodiment of the present disclosure.

The present disclosure also provides a method for manufacturing a touch panel. The method of the present disclosure will be described in detail below with reference to the touch panel described above. FIG. 6 is a flowchart of a method for manufacturing a touch panel according to the embodiment of the present disclosure. As illustrated in FIG. 6, the method includes, but is not limited to, steps S100, S200, S300, S400, S500, and S600, which are described below in detail.

Figure 7:
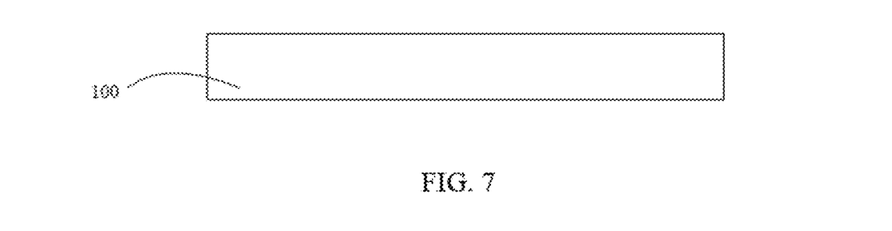
FIG. 7 is a schematic structural diagram corresponding to step S100 in FIG. 5.

S100: as illustrated in FIG. 7, a flexible substrate is provided.

The flexible substrate 100 is composed of polyimide film (PI) or polyester film and copper foil. Polyimide has been widely used due to its excellent properties such as high temperature soldering resistance, high strength, high modulus, and flame retardant. Polyimide, as a polymer material, it has outstanding thermal stability, good radiation resistance, good chemical stability, and excellent mechanical properties.

When providing the flexible substrate 100, the quality of the flexible substrate 100 needs to be detected to ensure that the flexible substrate 100 meets the quality requirements. If the flexible substrate 100 needs to be replaced if it does not meet the quality standards, so as to ensure that the manufactured touch panel reaches the normal index.

Specifically, whether the flexible substrate 100 meets the quality standard can be detected through infrared detection. An infrared detector is adopted to detect the flexible substrate 100 to obtain detection data. In the detection data, if data corresponds to some parts of the flexible substrate 100 is obviously small, it indicates that there are cracks or holes in the area, and the flexible substrate does not meet the quality standard. Therefore, the flexible substrate needs to be replaced to ensure the quality of the manufactured touch panel.

Sampling detection is performed on the flexible substrate 100 thus obtained.

In this embodiment, the flexible substrates 100 are sampled after multiple flexible substrates 100 are provided. The flexible substrate 100 can be sampled as follows. A preset number of flexible substrates 100 are selected randomly within a preset period, the size of each of the preset number of the flexible substrates 100 is measured, and whether the size of each of the preset number of the flexible substrates 100 is within an allowable value range is determined. If the size of the flexible substrate 100 is within the allowable value range, the method proceeds to the next step. If the size of the flexible substrate 100 exceeds the allowable value range, manufacturing parameters and the like of manufacturing tools are adjusted for the flexible substrate 100 to obtain a qualified flexible substrate 100.

Figure 8:
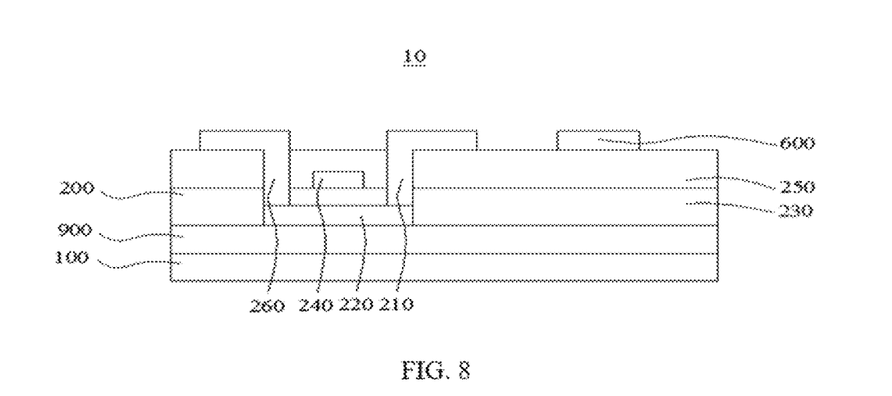
FIG. 8 is a schematic structural diagram corresponding to step S200 in FIG. 5.

S200: as illustrated in FIG. 8, a thin film transistor layer 200 which covers the flexible substrate 100 is formed, where the thin film transistor layer 200 includes a drain 210.

Figure 9:
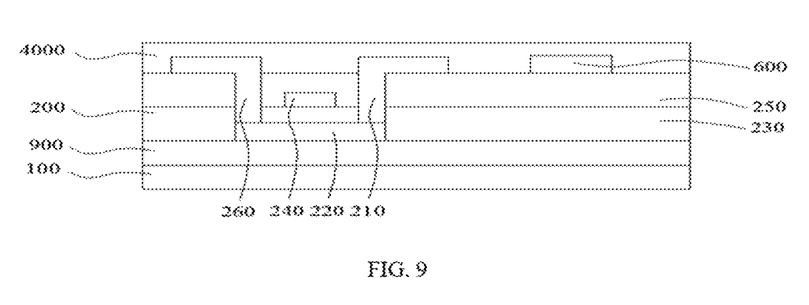
FIG. 9 is a schematic structural diagram corresponding to step S300 in FIG. 5.

S300: an anode layer 300 which covers the thin film transistor layer 200 is formed, where the anode layer 300 is electrically connected with the drain 210.

The anode layer 300 is disposed on the surface of the drain 210, and the anode layer 300 is electrically connected with the drain 210. The anode layer 300 may be electrically connected to the drain 210 either by direct surface contact there between or by a bridge connection. As illustrated in FIG. 9, the anode layer 300 can but is not limited to be made of a transparent conductive material such as indium tin oxide. In an embodiment, a whole layer of transparent conductive material 4000 which covers the thin film transistor layer 200 is formed. Then the whole transparent conductive material 4000 layer is patterned to form an anode layer 300 electrically connected with the drain 210. An insulating layer is disposed between the drain 210 and the anode layer 300, and a through hole is defined in the insulating layer. The anode layer 300 is electrically connected with the drain 210 through the through hole.

Figure 10:
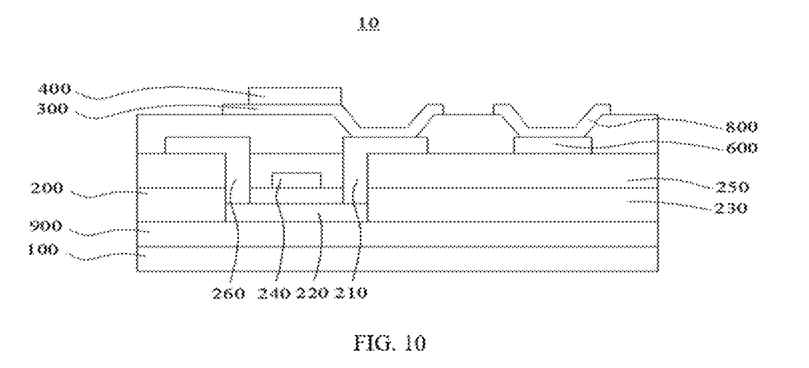
FIG. 10 is a schematic structural diagram corresponding to step S400 in FIG. 5.

S400: as illustrated in FIG. 10, a light emitting layer 400 which covers the anode layer 300 is formed.

The light emitting layer 400 is an organic light emitting layer.

Figure 11:
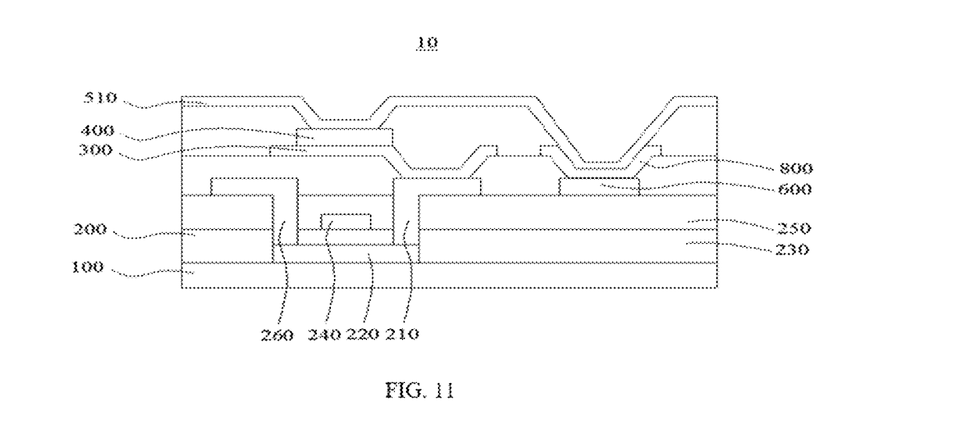
FIG. 11 is a schematic structural diagram corresponding to step S500 in FIG. 5.

S500: as illustrated in FIG. 11, a cathode layer 500 which covers the light emitting layer 400 is formed. The cathode layer 500 includes multiple touch electrodes 510 arranged in matrix, and the touch electrodes 510 are insulated from one another at intervals.

The cathode layer 500 includes multiple touch electrodes 510 arranged in matrix. The touch electrodes 510 can be in the shape of triangular, rectangular or rhombus. The shape of the touch electrodes 510 is not limited herein.

The touch electrodes 510 are insulated from one another at intervals, and insulating materials can be filled between the touch electrodes 510. On the one hand, the structure of the touch electrodes 510 can be supported to prevent the touch electrodes 510 from being damaged by external forces. On the other hand, accidental contact between the two adjacent touch electrodes 510, which causes the touch panel to fail, can be avoided.

Figure 12:
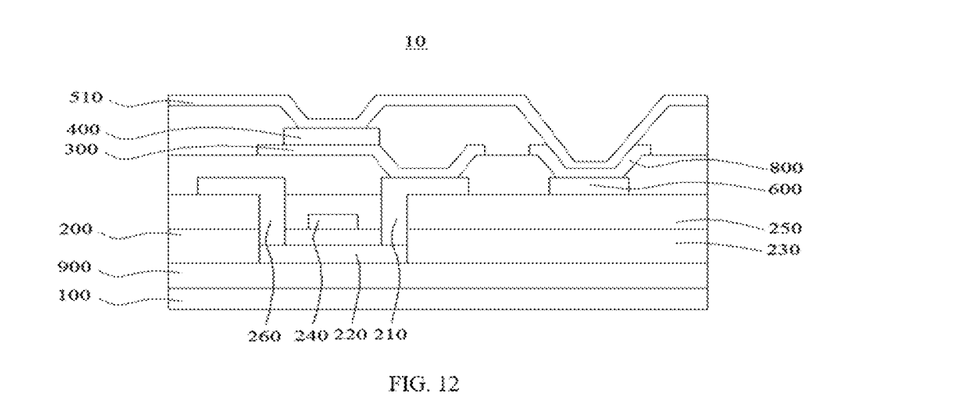
FIG. 12 is a schematic structural diagram corresponding to step S600 in FIG. 5.

S600: as illustrated in FIG. 12, a signal transmission line 600 which is electrically connected with each of the touch electrodes 510 is formed.

The signal transmission line 600 is disposed on the same layer as the drain 210 of the thin film transistor layer 200.

Specifically, the signal transmission line 600 and the drain 210 of the thin film transistor layer 200 are formed in the same process. That is, when the drain 210 of the thin film transistor layer 200 is patterned, positions at which the signal transmission line 600 is connected ("connection position" for short) are also patterned, so that the connection positions of the signal transmission line 600 are manufactured without additional holes. The process can be simplified.

As illustrated in FIG. 3 and FIG. 12, the signal transmission line 600 is disposed on the same layer as the gate 220 of the thin film transistor layer 200.

Specifically, the signal transmission line 600 and the gate 220 of the thin film transistor layer 200 are formed in one process. That is, when the gate 220 of the thin film transistor layer 200 is patterned, the connection positions of the signal transmission line 600 are patterned together, so that the connection position of the signal transmission line 600 are manufactured without additional holes. The process can be simplified.

Figure 13:
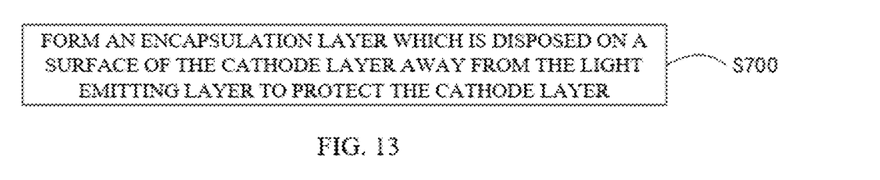
FIG. 13 is a flowchart of part of a method for manufacturing a touch panel according to an embodiment of the present disclosure.

As illustrated in FIG. 13 and FIG. 3, the method for manufacturing the touch panel further includes the following.

S700: an encapsulation layer 700 which is disposed on a surface of the cathode layer 500 away from the light emitting layer 400 is formed, where the encapsulation layer 700 is configured to protect the cathode layer 500.

The encapsulation layer 700 can insulate and isolate two adjacent touch electrodes 510. Specifically, when forming the encapsulation layer 700, the gap between the two adjacent touch electrodes 510 is filled to insulate and isolate the two adjacent touch electrodes 510. The encapsulation layer 700, on the one hand, acts as a packaging to protect the cathode layer 500, and on the other hand, acts as an isolating layer to insulate and isolate the two adjacent touch electrodes 510. No additional isolating layer is needed, which helps to simplify the process.

Figure 14:
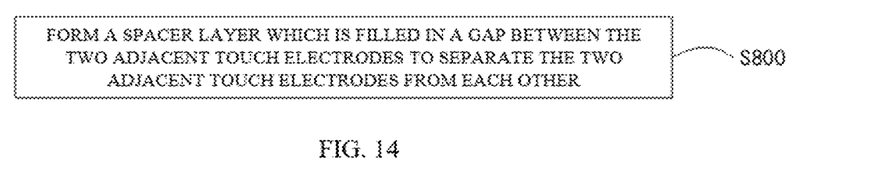
FIG. 14 is a flowchart of part of a method for manufacturing a touch panel according to an embodiment of the present disclosure.

As illustrated in FIG. 14 and FIG. 2, the method further includes the following.

S800: a spacer layer 3000 which is filled in a gap between the two adjacent touch electrodes 510 is formed, where the spacer layer 3000 is configured to separate the two adjacent touch electrodes 510 from each other.

The spacer layer 3000 is made of insulating material and has a network-like or strip-like structure. The spacer layer 3000 is filled in a gap between the two adjacent touch electrodes 510 to separate the two adjacent touch electrodes 510 from each other. Accidental contact between the two adjacent touch electrodes 510 can be avoided, thereby avoiding touch failing and helping to improve touch sensitivity.

Figure 15:
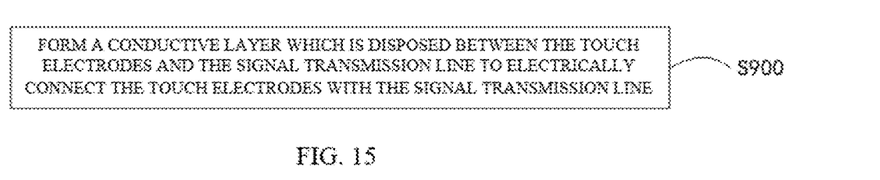
FIG. 15 is a flowchart of part of a method for manufacturing a touch panel according to an embodiment of the present disclosure.

As illustrated in FIG. 15, the method further includes the following.

S900: a conductive layer 800 which is disposed between the touch electrodes 510 and the signal transmission line 600 is formed, where the conductive layer 800 is configured to electrically connect the touch electrodes 510 with the signal transmission line 600.

Specifically, the conductive layer 800 is disposed between the touch electrodes 510 and the signal transmission line 600, which helps to reduce the contact resistance between the touch electrodes 510 and the signal transmission line 600, facilitate conduction, and achieve better information transmission between the touch electrode 510 and the signal transmission line 600.

Figure 16:
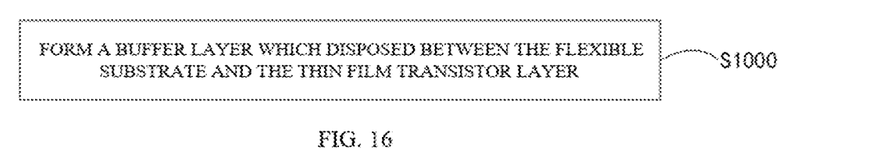
FIG. 16 is a flowchart of part of a method for manufacturing a touch panel according to an embodiment of the present disclosure.

As illustrated in FIG. 16, the method further includes the following.

S1000: as illustrated in FIG. 12, a buffer layer 900 which is disposed between the flexible substrate 100 and the thin film transistor layer 200 is formed.

Specifically, the buffer layer 900 is disposed between the flexible substrate 100 and the thin film transistor layer 200. This helps to reduce damage to the flexible substrate 100 when manufacturing various film layers such as the thin film transistor layer 200 on the flexible substrate 100, or to reduce impact on the flexible substrate 100 when using the touch panel, helping to prolong the service life of the touch panel 10.

Figure 17:
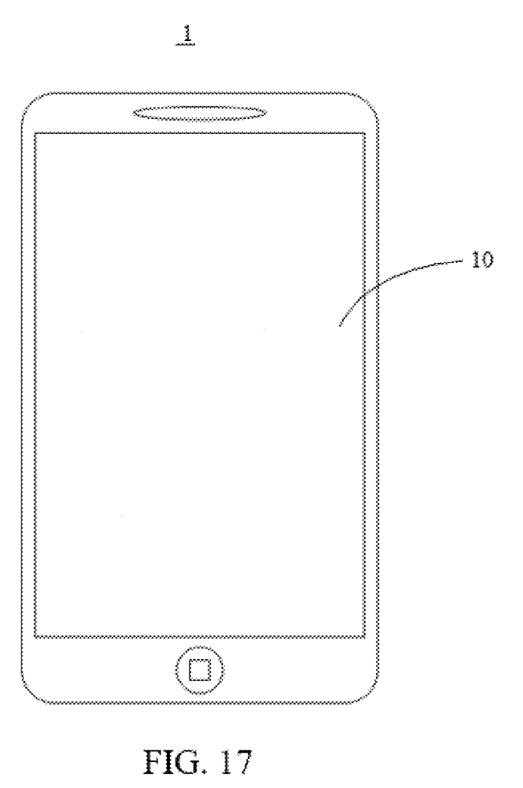
FIG. 17 is a schematic structural diagram of a touch device according to an embodiment of the present disclosure.

The present disclosure further provides a touch device 1. FIG. 17 is a schematic structural diagram of a touch device according to an embodiment of the present disclosure. As illustrated in FIG. 17, the touch device includes a touch panel 10. For details of the touch panel 10, reference can be made to the foregoing description and will not be repeated herein. The touch device 1 may be, but is not limited to, a flexible electronic books, a flexible smart phone (such as an Android phone, an iOS phone, a Windows Phone, etc.), a flexible tablet computer, a flexible palm computer, a flexible notebook computer, a mobile Internet devices (MID), or a wearable device, etc.

It should be noted that, the forgoing embodiments are only used to illustrate rather than limit the technical solutions of the present disclosure. Although the present disclosure has been described in detail with reference to the forgoing embodiments, those of ordinary skill in the art should understand that the scope of the present disclosure is not limited thereto, and modifications, equivalents, variants and improvements made within the spirit and principle of the present disclosure shall fall within the protection scope of the present disclosure. Thus, the protection scope of the present disclosure shall be limited by the protection scope of the claims.

What is claimed is:

1. A touch panel comprising a flexible substrate, a thin film transistor layer, an anode layer, a light emitting layer, and a cathode layer which are stacked in sequence, wherein the thin film transistor layer comprises a drain, the anode layer electrically connected with the drain; wherein the cathode layer comprises a plurality of touch electrodes arranged in matrix, the touch electrodes insulated from one another at intervals, and each touch electrode electrically connected with a signal transmission line; wherein time for displaying each frame in the touch panel comprises display time and touch detection time, and wherein
    within the display time, the anode layer is configured to be loaded with a first electrical signal, each touch electrode in the cathode layer configured to be loaded with a second electrical signal through a first signal line electrically connected with the signal transmission line, the first electrical signal cooperating with the second electrical signal to make the light emitting layer emit light; and
    within the touch detection time, each touch electrode in the cathode layer is configured to be loaded with a touch detection signal through a second signal line electrically connected with the signal transmission line, and the touch detection signal is used for detecting a position of a touch action on the touch panel.

2. The touch panel of claim 1, wherein within the touch detection time, each touch electrode in the cathode layer is configured to be loaded with a third electrical signal through the first signal line electrically connected with the signal transmission line, and the third electrical signal is used for cooperating with the first electrical signal to make the light emitting layer emit light.

3. The touch panel of claim 1, wherein the touch panel further comprises an amplifying circuit, and the amplifying circuit is configured to amplify the touch detection signal by a preset amplification factor.

4. The touch panel of claim 1, wherein the touch panel further comprises a filter circuit, and the filter circuit is configured to filter out clutter of the touch detection signal.

5. The touch panel of claim 1, wherein the signal transmission line is disposed on the same layer as the drain of the thin film transistor layer.

6. The touch panel of claim 1, wherein the signal transmission line is disposed on the same layer as a gate of the thin film transistor layer.

7. The touch panel of claim 1, wherein the touch panel further comprises an encapsulation layer, and the encapsulation layer is disposed on a surface of the cathode layer away from the light emitting layer to protect the cathode layer.

8. The touch panel of claim 1, wherein the touch panel further comprises a spacer layer, and the spacer layer is filled in a gap between two adjacent touch electrodes to separate the two adjacent touch electrodes from each other.

9. The touch panel of claim 1, wherein a conductive layer is disposed between the touch electrodes and the signal transmission line, and the conductive layer is configured to electrically connect the touch electrodes with the signal transmission line.

10. The touch panel of claim 1, wherein the touch panel further comprises a buffer layer, and the buffer layer is disposed between the flexible substrate and the thin film transistor layer.

11. A touch device comprising the touch panel of claim 1.

12. The touch device of claim 11, wherein within the touch detection time, each touch electrode in the cathode layer is configured to be loaded with a third electrical signal through the first signal line electrically connected with the signal transmission line, and the third electrical signal is used for cooperating with the first electrical signal to make the light emitting layer emit light.

13. The touch device of claim 11, wherein the touch panel further comprises an amplifying circuit, and the amplifying circuit is configured to amplify the touch detection signal by a preset amplification factor.

14. A method for manufacturing a touch panel, comprising:
providing a flexible substrate;
forming a thin film transistor layer which covers the flexible substrate, the thin film transistor layer comprising a drain;
forming an anode layer which covers the thin film transistor layer, the anode layer being electrically connected with the drain;
forming a light emitting layer which covers the anode layer;
forming a cathode layer which covers the light emitting layer, the cathode layer comprising a plurality of touch electrodes arranged in matrix, and the touch electrodes being insulated from one another at intervals; and
forming a signal transmission line electrically connected with each of the touch electrodes;
wherein time for displaying each frame in the touch panel comprises display time and touch detection time, and
within the display time, loading a first electrical signal on the anode layer, loading a second electrical signal on each touch electrode in the cathode layer through a first signal line electrically connected with the signal transmission line, cooperating the first electrical signal and the second electrical signal to make the light emitting layer emit light; and
within the touch detection time, loading a touch detection signal on each touch electrode in the cathode layer through a second signal line electrically connected with the signal transmission line, wherein the touch detection signal is used for detecting a position of a touch action on the touch panel.

15. The method of claim 14, wherein the signal transmission line is disposed on the same layer as the drain of the thin film transistor layer.

16. The method of claim 14, wherein the signal transmission line is disposed on the same layer as a gate of the thin film transistor layer.

17. The method of claim 14, further comprising:
forming an encapsulation layer which is disposed on a surface of the cathode layer away from the light emitting layer to protect the cathode layer.

18. The method of claim 14, further comprising:
forming a spacer layer which is filled in a gap between two adjacent touch electrodes to separate the two adjacent touch electrodes from each other.

19. The method of claim 14, further comprising:
forming a conductive layer which is disposed between the touch electrodes and the signal transmission line to electrically connect the touch electrodes with the signal transmission line.

20. The method of claim 14, further comprising:
forming a buffer layer which is disposed between the flexible substrate and the thin film transistor layer.

* * * * *